United States Patent
Watanabe et al.

(10) Patent No.: US 11,114,399 B2
(45) Date of Patent: Sep. 7, 2021

(54) SEMICONDUCTOR WAFER WITH VOID SUPPRESSION AND METHOD FOR PRODUCING SAME

(71) Applicant: JX NIPPON MINING & METALS CORPORATION, Tokyo (JP)

(72) Inventors: Takuto Watanabe, Kitaibaraki (JP); Katsuyuki Tsuchida, Kitaibaraki (JP)

(73) Assignee: JX NIPPON MINING & METALS COPRORATION, Tokyo (JP)

( * ) Notice: Subject to any disclaimer, the term of this patent is extended or adjusted under 35 U.S.C. 154(b) by 0 days.

(21) Appl. No.: 16/955,448

(22) PCT Filed: Oct. 25, 2018

(86) PCT No.: PCT/JP2018/039675
§ 371 (c)(1),
(2) Date: Jun. 18, 2020

(87) PCT Pub. No.: WO2019/123826
PCT Pub. Date: Jun. 27, 2019

(65) Prior Publication Data
US 2020/0350269 A1 Nov. 5, 2020

(30) Foreign Application Priority Data
Dec. 19, 2017 (JP) .............................. JP2017-242629

(51) Int. Cl.
*H01L 23/00* (2006.01)
*C23C 18/16* (2006.01)
(Continued)

(52) U.S. Cl.
CPC .......... *H01L 24/05* (2013.01); *C23C 18/1651* (2013.01); *C23C 18/36* (2013.01);
(Continued)

(58) Field of Classification Search
CPC combination set(s) only.
See application file for complete search history.

(56) References Cited

U.S. PATENT DOCUMENTS

| | | | | |
|---|---|---|---|---|
| 2007/0057022 A1* | 3/2007 | Mogami | .............. | H05K 3/3436 |
| | | | | 228/101 |
| 2010/0052148 A1* | 3/2010 | Hsu | ...................... | H05K 3/3436 |
| | | | | 257/692 |
| 2014/0332259 A1* | 11/2014 | Tsuchida | .................. | H05K 1/09 |
| | | | | 174/257 |

FOREIGN PATENT DOCUMENTS

| | | |
|---|---|---|
| JP | 2003297868 A | 10/2003 |
| JP | 2011003858 A | 1/2011 |
| JP | 2013194291 A | 9/2013 |

OTHER PUBLICATIONS

International Search Report issued in corresponding International Application No. PCT/JP2018/039675 with English translation, dated Dec. 4, 2018 (3 pages).

(Continued)

*Primary Examiner* — Mamadou L Diallo
(74) *Attorney, Agent, or Firm* — Flynn Thiel, P.C.

(57) ABSTRACT

A semiconductor wafer suppressed in voids produced in the interface between a passivation film and an electroless nickel plating film, and configured such that an electrode pad is entirely covered by the electroless nickel plating film. The semiconductor wafer includes, on a substrate, an electrode pad and a passivation film covering the upper surface of the substrate and an opening from which the electrode pad is exposed. The semiconductor wafer sequentially includes, on the electrode pad, an electroless nickel plating film, an electroless palladium plating film and an electroless gold plating film. A void, present in the interface between the passivation film and the electroless nickel plating film, has a length from the forefront of the void to the surface of the (Continued)

electrode pad of 0.3 μm or more and a width of 0.2 μm or less. The electrode pad is entirely covered by the electroless nickel plating film.

4 Claims, 3 Drawing Sheets

(51) Int. Cl.
*C23C 18/36* (2006.01)
*C23C 18/44* (2006.01)

(52) U.S. Cl.
CPC .............. *C23C 18/44* (2013.01); *H01L 24/03* (2013.01); *H01L 2224/03464* (2013.01); *H01L 2224/05011* (2013.01); *H01L 2224/05083* (2013.01); *H01L 2224/05144* (2013.01); *H01L 2224/05155* (2013.01); *H01L 2224/05164* (2013.01)

(56) References Cited

OTHER PUBLICATIONS

Written Opinion of International Searching Authority issued in corresponding International Application No. PCT/JP2018/039675, dated Dec. 4, 2018 (3 pages).

\* cited by examiner

SEMICONDUCTOR WAFER WITH VOID SUPPRESSION AND METHOD FOR PRODUCING SAME

TECHNICAL FIELD

The present invention relates to a semiconductor wafer and a method of producing the same.

CROSS-REFERENCE TO RELATED APPLICATION

This claims the benefit of priority to Japanese Patent Application No. 2017-242629, filed on 19 Dec. 2017, the content of which is incorporated herein by reference in its entirety.

BACKGROUND AND SUMMARY

With recent developments in light, thin, short and small semiconductor devices, the manner for bonding ICs (Integrated Circuits) with substrates or bonding ICs have been changed from conventional wire bonding to flip chip methods.

In order to bond an IC with a substrate or to bond ICs by flip chip methods, a UBM (Under Bump Metallurgy) is formed by deposition or plating on an electrode pad of Al, Cu, Au, or the like that has been formed on an IC, and a lead-free solder of Sn—Ag, Sn—Ag—Cu, or the like is then formed thereon by printing, ball mounting, or plating. The product is then bonded with an IC formed in a similar manner or a substrate by heating. Such a method has been used.

As a method for forming a UBM, cases using electroless plating, which is expected to save cost, are increasing. In the method for forming UBM by electroless plating, degreasing and soft etching are first performed in order to clean the portions (pads or wirings) to be plated on semiconductor wafers. This is followed by a catalyst application step. Zincate treatment for aluminum metal surfaces and palladium treatment for copper metal surfaces serve as the catalyst application step. This is generally followed by electroless nickel (Ni) plating and displacement electroless gold (Au) plating to form UBM of Ni/Au films. In case the covered wafer is exposed under high temperature or high humidity, Ni is diffused in the gold film and deposited on the surface to form an Ni oxide which adversely affects solder wettability and wire bonding performance. In this case, electroless palladium (Pd) plating which provides a barrier layer for Ni diffusion is generally performed between electroless nickel plating and displacement electroless gold plating to provide Ni/Pd/Au films. In the present invention, the symbol "/" means a structure of a plurality of plated films formed by the plating treatment steps, and the order of plated films described corresponds to the order of plating steps made from the substrate side.

When a passivation film (PV film) is formed on a substrate having an electrode pad, the electrode pad is exposed and an electrolessly-plated nickel film is formed on the electrode pad, the electrolessly-plated nickel film 13 is, as illustrated in FIG. 4A for example, formed to protrude from the electrode pad 12 so that the electrolessly-plated nickel film 13 covers a part of the surface of the passivation film 11.

In this case, the adhesiveness between the electrolessly-plated nickel film 13 and the passivation film 11 is low and as a result, a gap may be formed at the interface between the passivation film 11 and the electrolessly-plated nickel film 13. As illustrated in FIG. 4B, upon the following electroless gold plating, an electroless gold plating liquid penetrates into the gap between the passivation film 11 and the electrolessly-plated nickel film 13 formed thereon and corrodes nickel, causing the problem of generation of a void V. The void V may be easily generated and thus generation thereof is an issue particularly when Ni/Pd/Au films are formed.

Japanese Patent Application Publication No. 2003-297868 discloses, as a semiconductor device that prevents generation of voids, a semiconductor device including a wiring formed above a semiconductor chip, an insulating film (passivation film) formed on the wiring and having an opening on the wiring, and a bump electrode formed on the opening, wherein the area where the bump electrode is formed is smaller than the exposed area where the wiring is exposed from the opening. The semiconductor device is obtained by selectively removing an insulating film on a wiring to expose a pad region of the wiring, forming a masking film on the insulating film, the masking film having an opening on the pad region that is smaller than the pad region, and forming a bump electrode in the opening. After forming the masking film, an electrolessly-plated Ni film is formed in the opening to form the electrolessly-plated Ni film in a region that is smaller than the region of the electrode pad exposed and the masking film is removed after formation of the UBM. Thus, the insulating film and an electrolessly-plated Ni film are not in contact with each other.

In the method disclosed in Japanese Patent Application Publication No. 2003-297868, the passivation film and the bump electrode are not in contact with each other, and thus voids are not generated. However, the method requires formation of the masking film, which increases the number of production steps. In addition, a pad becomes exposed after removal of the masking film at the section of the pad of the wiring on which the masking film is formed.

An object of embodiments of the present invention is to provide a semiconductor wafer including, on a substrate, a passivation film, an electrode pad and, on the electrode pad, an electrolessly-plated nickel film, an electrolessly-plated palladium film and an electrolessly-plated gold film, wherein generation of voids at an interface between the passivation film and the electrolessly-plated nickel film is suppressed and the entire surface of the electrode pad is covered with the electrolessly-plated nickel film.

Embodiments of the present invention pertain to the following configurations:

(1) a semiconductor wafer, including:
   a substrate provided thereon with
   an electrode pad;
   a passivation film that covers the upper surface of the substrate and has an opening for exposing the electrode pad; and
   an electrolessly-plated nickel film formed on the electrode pad, an electrolessly-plated palladium film formed on the electrolessly-plated nickel film, and an electrolessly-plated gold film formed on the electrolessly-plated palladium film,
   wherein a void exists at an interface between the passivation film and the electrolessly-plated nickel film, the void having a length from a tip of the void to the surface of the electrode pad of 0.3 μm or more and a width of 0.2 μm or less, and the entire surface of the electrode pad is covered with the electrolessly-plated nickel film;

(2) the semiconductor wafer according to (1), wherein the electrolessly-plated nickel film, the electrolessly-plated palladium film, and the electrolessly-plated gold film have a film thickness of 0.5 µm to 15.0 µm, 0.02 µm to 0.50 µm, and 0.01 µm to 0.50 µm, respectively;

(3) the semiconductor wafer according to (1) or (2), wherein the electrolessly-plated gold film includes a displacement gold plated film and a reduction gold plated film, the displacement gold plated film has a thickness of 0.01 µm or less, and the reduction gold plated film has a thickness of 0.01 µm or more; and (4) a method for producing the semiconductor wafer according to any of (1) to (3), the method including the steps of:

forming the electrode pad on the substrate;

forming the passivation film on the upper surface of the substrate on which the electrode pad is formed;

forming the opening that exposes the electrode pad in the passivation film;

forming, on the exposed electrode pad, the electrolessly-plated nickel film, forming the electrolessly-plated palladium film, and forming the electrolessly-plated gold film, wherein forming the electrolessly-plated gold film includes forming an electrolessly-plated displacement gold film and forming an electrolessly-plated reduction gold film, and in forming the electrolessly-plated displacement gold film, electroless displacement gold plating is performed on the palladium plated film by using, as the electroless displacement gold plating liquid, an electroless displacement gold plating liquid that provides a plated film with a thickness of 20 nm or less upon plating at a plating temperature of 80° C. and a plating time of 15 minutes, or electroless displacement gold plating is performed under plating conditions that provide a plated film with a thickness of 20 nm or less when an electroless displacement gold plating liquid that provides a plated film with a thickness of above 20 nm upon plating at a plating temperature of 80° C. and a plating time of 15 minutes is used.

According to embodiments of the present invention, a semiconductor wafer including, a substrate provided thereon with a passivation film, an electrode pad, and an electrolessly-plated nickel film, an electrolessly-plated palladium film, and an electrolessly-plated gold film that are formed on the electrode pad, wherein generation of voids at an interface between the passivation film and the electrolessly-plated nickel film formed on the electrode pad is inhibited and the entire surface of the electrode pad is covered with the electrolessly-plated nickel film can be provided.

DETAILED DESCRIPTION

The semiconductor wafer according to embodiments of the present invention includes, on a substrate, an electrode pad, a passivation film covering the upper surface of the substrate and having an opening that exposes the electrode pad, an electrolessly-plated nickel film formed on the electrode pad, an electrolessly-plated palladium film formed on the electrolessly-plated nickel film, and an electrolessly-plated gold film formed on the electrolessly-plated palladium film, wherein a void existing at an interface between the passivation film and the electrolessly-plated nickel film has a length from a tip of the void to the surface of the electrode pad of 0.3 µm or more and a width of 0.2 µm or less, and the entire surface of the electrode pad is covered with the electrolessly-plated nickel film.

Figure 1:
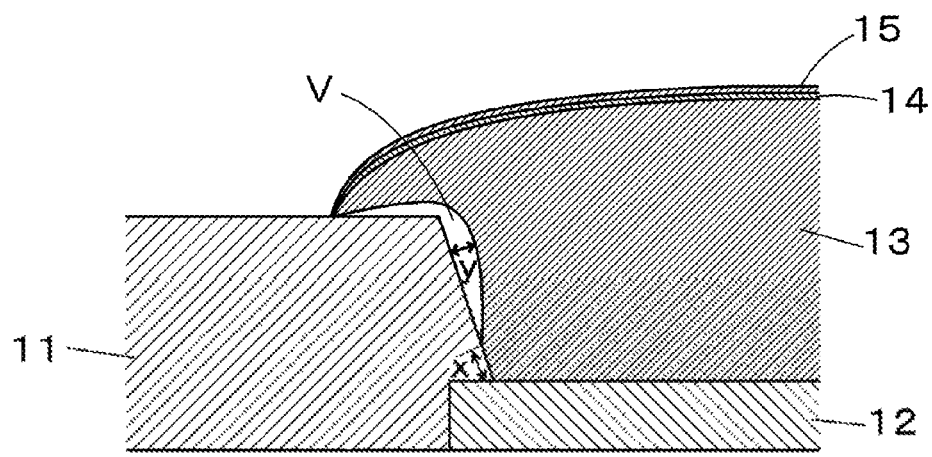
FIG. 1 is a cross-sectional view of an exemplary semiconductor wafer according to an embodiment of the present invention, which illustrates a length x from a tip of a void existing at an interface between a passivation film and an electrolessly-plated nickel film to the surface of an electrode pad, and a width y of the void.

FIG. 1 illustrates an example of a void generated at an interface between a passivation film and a nickel plated film when the electrolessly-plated nickel film formed upon electroless nickel plating on an electrode pad protrudes so that the electrolessly-plated nickel film covers a part of the surface of the passivation film. The electrolessly-plated nickel film 13 is formed also on the passivation film 11 and a void V is generated from a tip thereof along the passivation film 11.

In embodiments of the present invention, the void has a length from a tip of the void to the surface of the electrode pad of 0.3 µm or more and a width of 0.2 µm or less.

The length of a void from a tip of the void to the surface of the electrode pad and the width of the void can be measured by cross-sectioning the semiconductor wafer by FIB and observing the cross-section by SEM. FIG. 1 illustrates a method for measuring the length of a void in the present invention from a tip of the void to the surface of the electrode pad and a width of the void. The length from a tip of the void to the surface of the electrode pad refers to the distance x between a tip that is the closest to the electrode pad 12 among tips of the void V and the surface of the electrode pad 12 along the passivation film 11, namely the length of a portion on the passivation film 11 without a void from the electrode pad 12. The width of a void refers to a length in the vertical direction from the surface of the passivation film 11 to the electrolessly-plated nickel film 13 that is distanced from the surface of the passivation film 11, and the width of a void being 0.2 µm or less refers to the fact that the length y of the longest length of the part of the void from the surface of the passivation film 11 is 0.2 µm or less.

At least five voids V are observed, and it is required that all the measured voids have a length from the tip of the void to the surface of the electrode pad of 0.3 µm or more and a width of the void of 0.2 µm or less.

When a void exists, a treatment liquid is left in the void and may affect the reliability (property). When a void has a length from the tip of the void to the surface of the electrode pad of 0.3 µm or more and a width of 0.2 µm or less, a treatment liquid left in the void does not affect the reliability, and thus the reliability of the semiconductor wafer can be improved.

In the semiconductor wafer according to the embodiments of the present invention, the entire surface of the electrode pad is covered with the electrolessly-plated nickel film. When the electrode pad is exposed, reliability may be reduced.

Whether or not the entire surface of the electrode pad is covered with the electrolessly-plated nickel film can be checked by cross-sectioning by FIB and observing the cross-section by SEM.

In order to judge that the entire surface of the electrode pad is covered with the electrolessly-plated nickel film, the observation is performed for at least five sections and it is required that the entire surface of the electrode pad is covered with the electrolessly-plated nickel film in all the sections.

When the length x from a tip of a void to the surface of the electrode pad is 0<x, it can be judged that the entire surface of the electrode pad is covered with the electrolessly-plated nickel film.

Figure 2:
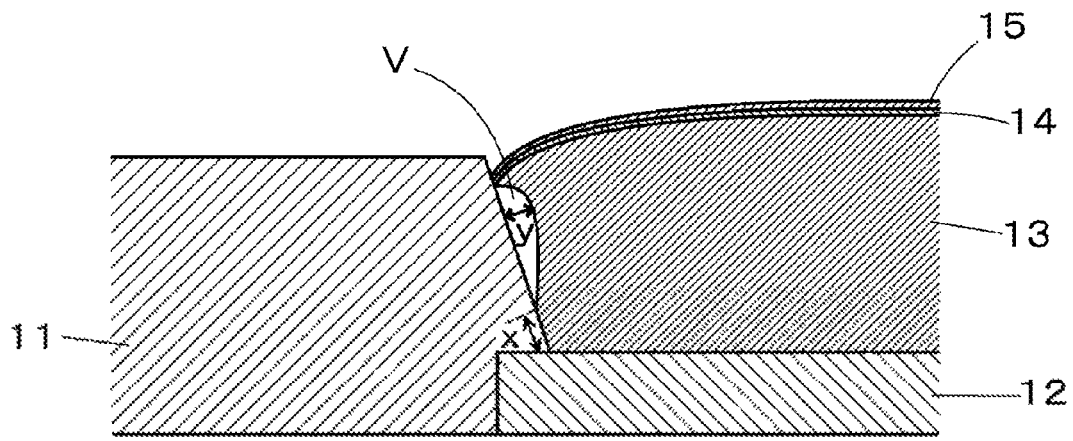
FIG. 2 is a cross-sectional view of another exemplary semiconductor wafer according to an embodiment of the present invention.

In the semiconductor wafer according to the embodiments of the present invention, the electrolessly-plated nickel film 13 may be formed, as illustrated in FIG. 2, to be in contact only with the side surface of the passivation film 11. Also in this case, a void V is generated between the passivation film 11 and the electrolessly-plated nickel film 13. The void V has a length x from a tip of the void to the surface of the electrode pad of 0.3 µm or more and a width y of 0.2 µm or less, as the case where the electrolessly-plated nickel film 13 is formed so that the electrolessly-plated nickel film 13 protrudes to cover a part of the surface of the passivation film 11.

The semiconductor wafer according to the embodiments of the present invention may be produced by a method including the steps of: forming an electrode pad on a substrate; forming a passivation film on the upper surface of the substrate on which the electrode pad is formed; forming an opening that exposes the electrode pad in the passivation film; forming, on the exposed electrode pad, an electrolessly-plated nickel film, forming an electrolessly-plated palladium film, and forming an electrolessly-plated gold film, wherein forming the electrolessly-plated gold film includes forming an electrolessly-plated displacement gold film and forming an electrolessly-plated reduction gold film, and in forming the electrolessly-plated displacement gold film, electroless displacement gold plating is performed on the palladium plated film by using, as the electroless displacement gold plating liquid, an electroless displacement gold plating liquid that provides a plated film with a thickness of 20 nm or less upon plating at a plating temperature of 80° C. and a plating time of 15 minutes, or electroless displacement gold plating is performed under plating conditions that provide a plated film with a thickness of 20 nm or less when an electroless displacement gold plating liquid that provides a plated film with a thickness of above 20 nm upon plating at a plating temperature of 80° C. and a plating time of 15 minutes is used.

At the interface, the electrolessly-plated nickel film formed on the electrode pad and the passivation film (such as an SiN, SiO$_2$, or polyimide resin film) are merely in close physical contact, and a gap may be generated therebetween when the films have a difference in coefficient of thermal expansion or the like.

Upon electroless gold plating, a gold plating liquid enters the gap and if the gold plating liquid is highly corrosive (has high displacement reactivity), a void is generated.

When an electrolessly-plated gold film is formed in the mode of an electrolessly-plated nickel film/an electrolessly-plated palladium film/an electrolessly-plated gold film (Ni/Pd/Au) by electroless displacement gold plating using a displacement gold plating liquid that is commonly used for Ni/Pd/Au under general conditions, in view of high displacement reactivity of the gold plating liquid, voids may be generated, Ni pitting corrosion may occur not only on the pad side but also on the surface and the thickness of the Au film may increase over time.

Thus, in the method for producing the semiconductor wafer according to the embodiments of the present invention, forming the electrolessly-plated gold film, for the Ni/Pd/Au mode, includes forming an electroless displacement gold plating film and forming an electroless reduction gold plating film, and in forming the electroless displacement gold plating film, electroless displacement gold plating is performed on the palladium plating film by using, as the electroless displacement gold plating liquid, an electroless displacement gold plating liquid that has low displacement reactivity and provides a plating film thickness of 20 nm or less upon plating at a plating temperature of 80° C. and a plating time of 15 minutes, or electroless displacement gold plating is performed under plating conditions that provide a plating film thickness of 20 nm or less when an electroless displacement gold plating liquid that provides a plating film thickness of above 20 nm upon plating at a plating temperature of 80° C. and a plating time of 15 minutes is used.

The electroless displacement gold plating liquid that provides a plated film with a thickness of 20 nm or less upon plating at a plating temperature of 80° C. and a plating time of 15 minutes on the palladium plated film does not have high displacement reactivity of gold plating, and thus almost no void is generated even when the gold plating liquid enters a gap between the passivation film and the electrolessly-plated nickel film. Electroless displacement gold plating performed by using the electroless displacement gold plating liquid that provides a plated film with a thickness of 20 nm or less upon plating at a plating temperature of 80° C. and a plating time of 15 minutes is preferably performed under conditions that provide a resulting plated film with a thickness of 20 nm or less.

When an electroless displacement gold plating liquid that has high displacement reactivity and provides a plated film with a thickness of above 20 nm upon plating at a plating temperature of 80° C. and a plating time of 15 minutes is used, electroless displacement gold plating is performed under plating conditions that provide a plated film with a thickness of 20 nm or less. By performing electroless displacement gold plating under such weak plating conditions that provide a plated film with a thickness of 20 nm or less, the gold plating displacement reactivity is weakened and almost no void is generated even when the gold plating liquid enters a gap between the passivation film and the electrolessly-plated nickel film.

Examples of the plating conditions that provide a plated film with a thickness of 20 nm or less include a decreased plating temperature and a decreased plating time. It is preferable that the conditions provide a plated film with a thickness of 15 nm or less and more preferably 10 nm or less.

The plating time is preferably 1 minute to 30 minutes and more preferably 1 minute to 15 minutes. When the plating time is prolonged, the gold plating liquid may enter a gap between the passivation film and the electrolessly-plated nickel film to generate a void. When the plating time is too short, a gold plated film may not be sufficiently formed.

The plating temperature may vary according to the displacement reactivity of the electroless displacement gold plating liquid used. However, when an electroless displacement gold plating liquid that provides a plated film with a thickness of 20 nm or less upon plating at a plating temperature of 80° C. and a plating time of 15 minutes is used, the plating temperature is preferably 10° C. to 95° C. and more preferably 50° C. to 85° C. When an electroless displacement gold plating liquid that provides a plated film with a thickness of above 20 nm upon plating at a plating temperature of 80° C. and a plating time of 15 minutes is used, the plating temperature is preferably below 80° C.

In electroless displacement gold plating as above, the palladium film is covered with gold after a certain period of time and the reaction terminates, and thus the film thickness of gold does not increase any more.

When an electroless displacement gold plated film is formed on an electrolessly-plated palladium film by using an electroless displacement gold plating liquid that provides a plated film with a thickness of 20 nm or less upon plating at a plating temperature of 80° C. and a plating time of 15 minutes, or when an electroless displacement gold plated film is formed under plating conditions that provide a plated film with a thickness of 20 nm or less by using an electroless displacement gold plating liquid that provides a plated film with a thickness of above 20 nm upon plating at a plating temperature of 80° C. and a plating time of 15 minutes, the gold plated film with a thickness does not increase. Therefore, it is preferable to increase the gold film thickness by further performing electroless reduction gold plating.

Examples of the substrate include a substrate having an electrode for a semiconductor wafer.

The electrode pad formed on the semiconductor substrate is preferably aluminum-based, copper-based, silver-based or gold-based.

As a wafer of the semiconductor wafer, a silicon wafer may be used, and an electrode pad is formed on a substrate according to a common process, a passivation film is formed on the upper surface of the substrate on which the electrode pad is formed, and an opening that exposes the electrode pad is formed in the passivation film. It is preferable that the outermost surface of the electrode pad is formed of a copper-based or aluminum-based surface and the electrode pad is subjected to electroless nickel plating.

The wafer may be a GaAs substrate. In this case, it is preferable that the outermost surface of the electrode is formed of a gold surface and is subjected to electroless nickel plating.

The copper-based electrode surface as described above may be of any known copper that is used for electrodes of semiconductor wafers, and for example copper and alloys thereof such as pure copper and phosphor bronze may be used. The aluminum-based electrode surface may be of known aluminum that is used for electrodes of semiconductor wafers, and for example pure aluminum or aluminum alloys such as AlCu (0.5%) and AlSi (1%) may be used. The gold-based electrode surface may be of known gold that is used for electrodes of semiconductor wafers, and examples thereof include Ti/Pt/Au and the like.

The electrode pad may be formed according to existing methods under existing conditions.

The passivation film may be those generally used and examples thereof include silicon nitride (SiN), silicon oxide, polyimide, and the like. The film thickness is preferably 1 µm or less for silicon nitride or silicon oxide and 0.5 µm to 15 µm for polyimide (PI).

The passivation film may be formed according to existing methods under existing conditions.

An opening that exposes the electrode pad may also be formed in the passivation film according to existing methods under existing conditions.

The electrolessly-plated nickel film is formed on the electrode pad.

The procedures are indicated below when, for example, electroless nickel plating is performed on a copper-based electrode surface:

degreasing→etching→acid immersion→activation (catalyst application)→electroless nickel plating.

The procedures are indicated below when electroless nickel plating is performed on an aluminum-based electrode surface:

degreasing→acid immersion→primary zincate→acid immersion→secondary zincate→electroless nickel plating.

When the aluminum-based electrode is AlSi, an etching step is provided after the degreasing step. When the electrode is AlCu, an etching step may be provided after the degreasing step depending on the extent of the residue.

The procedures are indicated below when electroless nickel plating is performed on a silver-based electrode surface:

degreasing→activation (catalyst application)→electroless nickel plating.

The procedures are indicated below when electroless nickel plating is performed on a gold-based electrode surface:

degreasing→activation→activation (catalyst application)→electroless nickel plating.

The steps of "degreasing", "acid immersion", "activation (catalyst application)", "primary zincate", "secondary zincate", and "activation" may be performed according to existing methods under existing conditions. When there is a residue of the pad, plating ability is improved by performing plasma cleaning before degreasing.

The electrolessly-plated palladium film is formed after forming the electrolessly-plated nickel film.

The plating liquids and plating methods for electroless nickel plating and electroless palladium plating may be known plating liquids and plating methods for UBM formation for semiconductor wafers.

In order to obtain the semiconductor wafer according to the embodiments of the present invention, the plating liquid used for electroless nickel plating is preferably a medium-phosphorus electroless nickel plating liquid containing sodium phosphinate as a reducing agent and the electroless palladium plating liquid is preferably an electroless palladium plating liquid containing sodium phosphinate as a reducing agent.

Each of the plated films may have a film thickness that may vary according to the application or demand characteristics of the wafer. However, the electrolessly-plated nickel film preferably has a film thickness in the range of 0.5 µm to 15.0 µm. The film thickness is preferably 1.5 µm or more, and more preferably 1.5 µm to 10 µm, in view of prevention of solder diffusion in case of solder joining.

The palladium plated film has a film thickness of, in view of prevention of nickel diffusion, preferably 0.02 µm or more, more preferably 0.02 µm to 0.50 µm and still more preferably 0.03 µm to 0.20 µm.

The gold plated film has a film thickness of, in view of wetting upon solder joining, preferably 0.01 µm or more, more preferably 0.01 µm to 0.50 µm and still more preferably 0.02 µm to 0.20 µm.

The film thickness of the electrolessly-plated nickel film, electrolessly-plated palladium film, or electrolessly-plated gold film may be determined by cross-sectioning the plated film by FIB and observing the same by SEM or STEM. It is convenient and preferable to measure with a commercially available fluorescent X-ray coating thickness gauge. When the measurement is performed with a fluorescent X-ray coating thickness gauge, an accurate film thickness is obtained by multiplying a value measured by the fluorescent X-ray coating thickness gauge by a correction factor so as to conform to the value of the cross-section determined by FIB/SEM (or STEM) described above.

The film thicknesses of the plated films were measured at a nearly central part of the electrode pad where the surfaces and interfaces of the plated films were parallel to the electrode pad.

In the semiconductor wafer according to the embodiments of the present invention, it is preferable that the electrolessly-plated gold film has a displacement gold plated film and a reduction gold plated film and the displacement gold plated film has a thickness of 0.01 μm or less and the reduction gold plated film has a thickness of 0.01 μm or more.

Since displacement gold plating may be a cause of generation of voids, a thinner plated film (shorter plating time) is preferred. However, a reduction gold plated film does not grow unless the displacement gold plated film has a sufficient film thickness. The lower limit of the displacement gold plated film with a thickness is preferably 0.002 μm or more.

The film thicknesses of the displacement gold plated film and the reduction gold plated film can be analyzed by AES depth profiling.

Figure 3A:
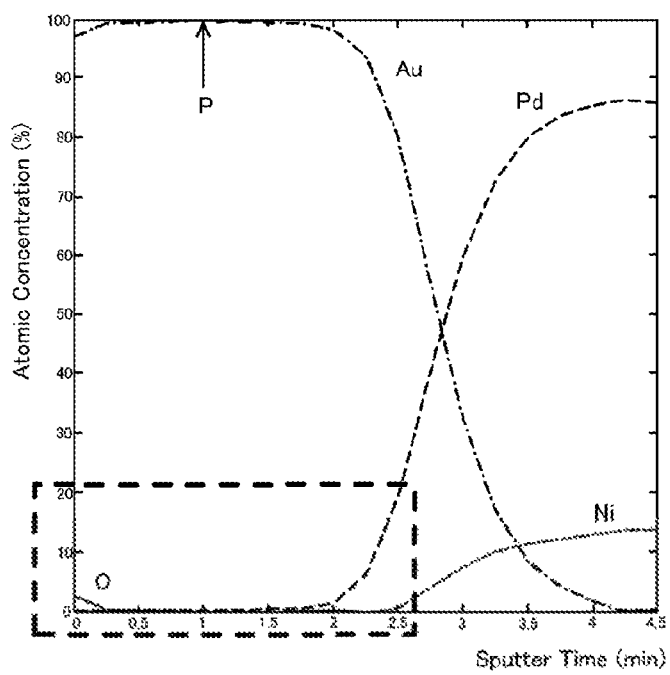
FIG. 3A is a view illustrating an AES depth profile of a semiconductor wafer including an electrolessly-plated nickel film, an electrolessly-plated palladium film formed on the electrolessly-plated nickel film, and an electrolessly-plated displacement gold film, and an electrolessly-plated reduction gold film formed on the electrolessly-plated palladium film.
Figure 3B:
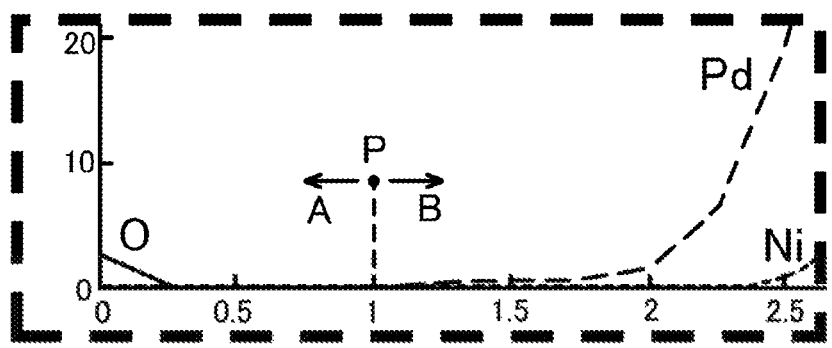
FIG. 3B is a partially magnified view of the AES depth profile illustrated in FIG. 3A.
Figure 4A:
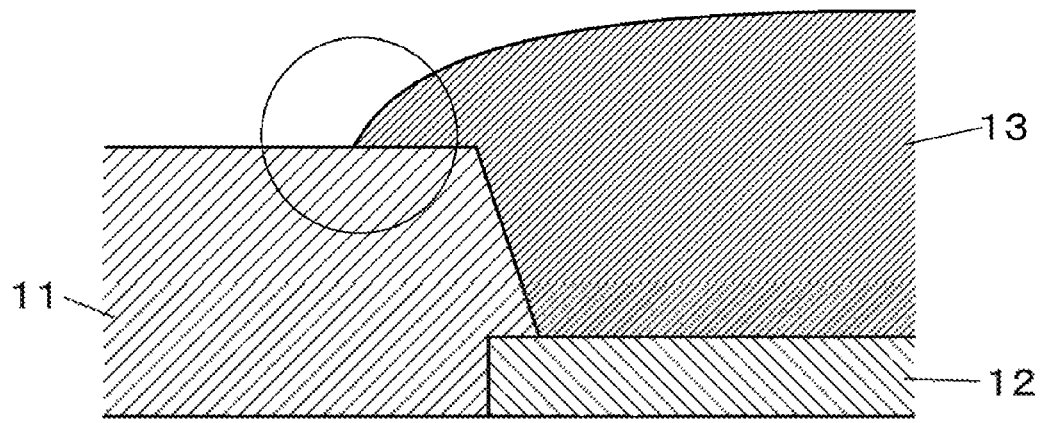
FIG. 4A is a view illustrating an electrolessly-plated nickel film of a semiconductor wafer that is formed to cover a part of a passivation film surface.
Figure 4B:
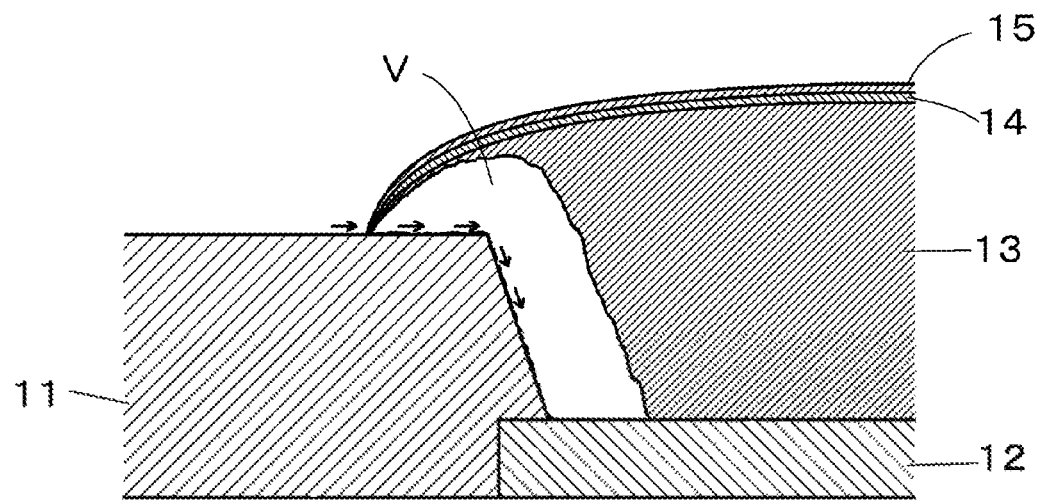
FIG. 4B is a view illustrating a void between a passivation film and a nickel plated film of a semiconductor wafer.

FIG. 3A illustrates an example of the AES depth profile of a semiconductor wafer including an electrolessly-plated palladium film, an electroless displacement gold plated film, and an electroless reduction gold plated film on an electrolessly-plated nickel film. FIG. 3B illustrates a partially magnified view of the AES depth profile illustrated in FIG. 3A. In an example illustrated in FIG. 3A, the sputtering rate was about 25 nm/min (10 nm/min in terms of $SiO_2$). Because the palladium concentration surpassed the gold concentration after the sputtering time of 2.8 minutes, it is found that gold is up to the sputtering time of 2.8 minutes and the gold film thickness is approximately 70 nm. In FIG. 3A and FIG. 3B, the points labelled with P are where palladium is started to be detected and is a boundary between reduction gold plating and displacement gold plating. It is believed that the region indicated with A up to the sputtering time of 1.0 minute where palladium is detected is a reduction gold plated film and the region thereafter indicated with B is a displacement gold plated film. Thus, the reduction gold plated film has a film thickness of 25 nm and the displacement gold plated film has a film thickness of 45 nm.

It has been described above with the example in which the displacement gold plated film has a film thickness of 45 nm for the sake of clarity. However, it is preferable that the displacement gold plated film has a film thickness of 0.01 μm or less in the present invention. It is also preferable that the reduction gold plated film has a thickness of 0.01 μm or more.

The plating liquid used for electroless displacement gold plating performed after electroless palladium plating is generally a displacement gold plating liquid marketed for Ni/Pd/Au, and when electroless displacement gold plating is performed after electroless nickel plating, a displacement gold plating liquid marketed for Ni/Au is used.

The reactivity (displacement ability) of Au is different on Ni from on Pd, namely displacement is more difficult on Pd. Displacement gold plating for Ni/Pd/Au is required to have a composition that can cause stronger displacement than displacement gold plating for Ni/Au, and thus plating reagent manufacturers market different plating liquids for displacement gold plating for Ni/Au and displacement gold plating for Ni/Pd/Au.

In the present invention, the gold plated film may be formed on the palladium plated film by using, as a plating liquid for electroless displacement gold plating performed after electroless palladium plating, an electroless displacement gold plating liquid that provides a plated film with a thickness of 20 nm or less upon plating at a plating temperature of 80° C. and a plating time of 15 minutes. Examples of the electroless displacement gold plating liquid that provides a plated film with a thickness of 20 nm or less upon plating at a plating temperature of 80° C. and a plating time of 15 minutes on the palladium plated film include displacement gold plating liquids for Ni/Au. The electroless displacement gold plating liquid has low reactivity, and thus when plating is performed on Ni/Pd, almost no void is generated or a void is small, if any. However, because of low reactivity, the liquid provides a thinner plated film with a thickness than displacement gold plating for Ni/Pd/Au.

In the present invention, an electroless displacement gold plating liquid that provides a plated film with a thickness of above 20 nm upon plating at a plating temperature of 80° C. and a plating time of 15 minutes on the palladium plated film may also be used as a plating liquid for electroless displacement gold plating performed after electroless palladium plating. In this case, electroless displacement gold plating is performed under plating conditions that provide a plated film with a thickness of 20 nm or less. Examples of the electroless displacement gold plating liquid that provides a plated film with a thickness of above 20 nm upon plating at a plating temperature of 80° C. and a plating time of 15 minutes on the palladium plated film include displacement gold plating liquids for Ni/Pd/Au.

Displacement gold plating for Ni/Pd/Au has strong reactivity, and thus the resulting plated film with a thickness is above 20 nm when displacement gold plating is performed under general plating conditions. However, when performing displacement gold plating under weak reactive conditions that provide a plated film with a thickness of 20 nm or less, corrosion of Ni due to the liquid penetrated from the sides and generation of voids may be inhibited.

The electroless displacement gold plating liquid that is used for electroless displacement gold plating and provides a plated film with a thickness of 20 nm or less upon plating at a plating temperature of 80° C. and a plating time of 15 minutes on the palladium plated film preferably contains a non-cyanogen-based water-soluble gold compound and a pyrosulfurous acid compound. For example, a known electroless displacement gold plating liquid used for Ni/Au may be used.

The non-cyanogen-based water-soluble gold compound is not particularly limited as long as the compound is a non-cyanogen gold compound. Preferably, gold sulfite, gold thiosulphate, gold thiocyanate, chloroauric acid, or a salt thereof may be used. The salt that may be used is an alkali metal salt, an alkaline earth metal salt, an ammonium salt, or the like, among which a sodium salt, a potassium salt, an ammonium salt, or the like is preferable.

The electroless displacement gold plating liquid preferably contains the gold compound in the plating liquid at a gold concentration of 0.1 g/L to 100 g/L and more preferably 0.5 g/L to 20 g/L. When the gold concentration is less than 0.1 g/L, the displacement rate of gold is significantly slow and the concentration of above 100 g/L does not provide an advantage because of the saturated effect.

The pyrosulfurous acid compound which may be used is preferably pyrosulfurous acid or an alkali metal salt, alkaline earth metal salt, ammonium salt, or the like thereof, and is preferably sodium pyrosulfite, potassium pyrosulfite, ammonium pyrosulfite or the like. The plating liquid preferably contains the pyrosulfurous acid compound at 0.1 g/L to 200 g/L and more preferably 1 g/L to 100 g/L. When the concentration of the pyrosulfurous acid compound is less than 0.1 g/L, an effect for preventing heterogeneous corrosion of the underlying nickel is low, and the concentration of above 200 g/L does not provide an advantage because of the saturated effect.

The electroless displacement gold plating liquid preferably contains a thiosulfate compound.

The thiosulfate compound which may be used is an alkali metal salt, alkaline earth metal salt, ammonium salt, or the like of thiosulfuric acid, and is preferably sodium thiosulphate, potassium thiosulphate, ammonium thiosulphate, or the like. The plating liquid preferably contains the thiosulfate compound at 1 mg/L to 10 g/L and more preferably 10 mg/L to 1000 mg/L. When the concentration of the thiosulfate compound is less than 1 mg/L, an effect for improving solder bonding strength is low, and the concentration of above 10 g/L does not provide an advantage in view of the saturated effect.

The electroless displacement gold plating liquid preferably contains, as a stabilizing agent, a sulfurous compound. Examples of the sulfurous acid compound include sulfurous acid or an alkali metal salt, alkaline earth metal salt, ammonium salt, and the like thereof. The concentration of the sulfurous acid compound in the plating liquid is preferably 0.1 g/L to 200 g/L and more preferably 1 g/L to 100 g/L. When the concentration is less than 0.1 g/L, an effect as a stabilizing agent is not exhibited, and the concentration of above 200 g/L does not provide an advantage in view of the saturated effect.

The electroless displacement gold plating liquid may further contain, as a complexing agent, an aminocarboxylic acid compound. Examples of the aminocarboxylic acid compound include ethylenediaminetetraacetic acid, (hydroxyethyl) ethylenediaminetriacetic acid, (dihydroxyethyl) ethylenediaminediacetic acid, propanediaminetetraacetic acid, diethylenetriaminepentaacetic acid, triethylenetraminehexaacetic acid, glycine, glycylglycine, glycylglycylglycine, dihydroxyethylglycine, iminodiacetic acid, hydroxyethyliminodiacetic acid, nitrilotriacetic acid, nitrilotripropionic acid, or an alkali metal salt, alkaline earth metal salt, ammonium salt thereof, and the like. The concentration of the aminocarboxylic acid compound in the plating liquid is preferably 0.1 g/L to 200 g/L and more preferably 1 g/L to 100 g/L. When the concentration of the aminocarboxylic acid compound is less than 0.1 g/L, an effect as a complexing agent is low, and the concentration of above 200 g/L does not provide an advantage in view of the saturated effect.

The electroless displacement gold plating liquid may optionally contain, as a pH buffering agent, a phosphoric acid compound.

Examples of the phosphoric acid compound include phosphoric acid, pyrophosphoric acid or an alkali metal salt, alkaline earth metal salt, and ammonium salt thereof; dihydrogen phosphate alkali metal salt, dihydrogen phosphate alkaline earth metal salt, ammonium dihydrogen phosphate, hydrogen phosphate dialkali metal salt, hydrogen phosphate dialkaline earth metal salt, diammonium hydrogen phosphate, and the like. The concentration of the phosphoric acid compound in the plating liquid is preferably 0.1 g/L to 200 g/L and more preferably 1 g/L to 100 g/L.

The pH of the electroless displacement gold plating liquid is preferably adjusted to pH 4 to 10 and more preferably pH 5 to 9 by using the above compound as a pH buffering agent.

The electroless displacement gold plating liquid is preferably used at a bath temperature of 10° C. to 95° C. and more preferably 50° C. to 85° C.

When the plating liquid has a pH and a bath temperature which are outside of the above ranges, there may be problems of a slow plating rate or bath decomposition.

The electroless displacement gold plating liquid that is used for electroless displacement gold plating and provides a plated film with a thickness of above 20 nm upon plating at a plating temperature of 80° C. and a plating time of 15 minutes on the palladium plated film may be a known electroless displacement gold plating liquid for Ni/Pd/Au.

After electroless displacement gold plating, electroless reduction gold plating is performed.

The electroless reduction gold plating liquid may be a commercially available one. The electroless reduction gold plated film is preferably 0.01 μm or more and 0.50 μm or less. When the film is less than 0.01 μm, solder properties and wire bonding performance may gradually decrease as the film thickness decreases. With the film thickness of above 0.50 μm, the properties do not change, and thus 0.50 μm or less is preferable in terms of cost. The film thickness is more preferably 0.02 μm to 0.20 μm.

The present invention is not limited to the embodiments and may be embodied by modifying the constituents within the range that does not depart from the scope thereof. Various embodiments of the invention may be formed by appropriately combining more than one constituent disclosed in the embodiments. For example, some constituents may be omitted from all constituents described in the embodiments. Constituents from different embodiments may also be combined appropriately.

EXAMPLES

Specific examples of the embodiments of the present invention are described hereinbelow. The Examples are provided for better understanding of the present invention and advantages thereof, and do not intend to limit the present invention.

Example 1 to Example 7, Comparative Example 1 and Comparative Example 2

Electroless plating was performed with an Si wafer of 8 inches having the electrode pad and the passivation film indicated below on a substrate under the processes and conditions indicated in Table 1-1 and Table 1-2 below. Si wafer (8 inches)

Electrode: AlCu pad, film thickness 5 μm, pad opening diameter 300 μm, circular

Passivation: indicated in Table 1

In Table 1, "O" indicates that the treatment was performed.

The plating liquid "FA500 (manufactured by JX Nippon Mining & Metals Corporation)" used for electroless displacement gold plating is a plating liquid that provides a plated film with a thickness of 15 nm upon plating at a plating temperature of 80° C. and a plating time of 15 minutes on a palladium plated film. The "FA210 (manufactured by JX Nippon Mining & Metals Corporation)" is a plating liquid that provides a plated film with a thickness of 30 nm upon plating at a plating temperature of 80° C. and a plating time of 15 minutes on a palladium plated film.

The semiconductor wafers after electroless displacement gold plating and electroless reduction gold plating were subjected to AES analysis to determine the thicknesses of the displacement gold plated films and the reduction gold plated films.

In order to analyze the deposition of resulting electroless plating and the status of voids, the plated films were subjected to microscopy after plating and measurement of the plated film with a thickness using a fluorescent X-ray coating thickness gauge.

For observation of voids (measurement of the length such as x and y), the cross-sectional SEM of the edges of the pads was observed. Five cross sections per sample were observed and the shortest value of the length x from a tip of a void to the surface of the electrode pad and the longest value of the width y of the void were measured.

The results of the measurements are also indicated in Table 1.

Evaluation of Solder Properties

On a plated film, Sn—Ag—Cu solder balls (150 μm diameter) were mounted, solder bumps were formed by reflow (five times) under the conditions indicated below followed by the solder shear test to evaluate the adhesiveness of plating from the breakage interface.

Reflow Heating Conditions
Temperature: heating at peak top 265° C.; heated at 260° C. or higher for 40 seconds
Atmosphere: nitrogen atmosphere (oxygen concentration: 600 ppm to 800 ppm)
Solder balls used: Sn-3% Ag-0.5% Cu (150 μm diameter)
Solder shear test conditions
Solder shear rate: 100 μm/sec
Solder shear height: 10 μm from the plating/solder joint surface
Reliability Test On a plated film, Sn—Ag—Cu solder balls (150 μm diameter) were mounted as the above evaluation of solder properties followed by the HAST test (left to stand at 120° C. and 85% RH for 96 hr), and the cross-sections at five points in a sample at the edges of the pad were analyzed. The number of corrosion of Al due to penetrated water from voids is also indicated in Table 1 (HAST: High Accelerated Stress Test).

TABLE 1

| Wafer | | Configuration of passivation Reagent | SiN (μm) only or SiN (μm)/Pl (μm) Treatment conditions | Examples 1 SiN 0.5 μm thick | 2 SiN 0.5 μm/ PT 5 μm thick | 3 SiN 0.5 μm/ Pl 5 μm thick | 4 SiN 0.5 μm thick |
|---|---|---|---|---|---|---|---|
| Processes | Degreasing | WSD400* | 50° C., 2 min | ✓ | ✓ | ✓ | ✓ |
| | Etching | UAEI00* | 50° C., 1 min | ✓ | ✓ | ✓ | ✓ |
| | 30% nitric acid | — | 20° C., 30 sec | ✓ | ✓ | ✓ | ✓ |
| | Zincate | WBZ100* | 20° C., 30 sec | ✓ | ✓ | ✓ | ✓ |
| | 30% nitric acid | — | 20° C., 15 sec | ✓ | ✓ | ✓ | ✓ |
| | Zincate | WBZ100* | 20° C., 15 sec | ✓ | ✓ | ✓ | ✓ |
| | Electroless Ni plating | UBN100* | 80° C., 7.5 min | ✓ | | | ✓ |
| | | | 80° C., 25 min | | ✓ | | |
| | | | 80° C., 50 min | | | ✓ | |
| | Electroless Pd plating | CA400* | 56° C., 2 min | ✓ | ✓ | ✓ | |
| | | | 56° C., 4 min | | | | ✓ |
| | Electroless displacement Au plating | FA500* | 75° C., 6 min | ✓ | ✓ | ✓ | ✓ |
| | | FA210* | 80° C., 15 min | | | | |
| | | | 75° C., 6 min | | | | |
| | | | 80° C., 15 min | | | | |
| | Electroless reduction Au plating | RAP3* | 45° C., 3 min | ✓ | ✓ | ✓ | ✓ |
| | Target thickness of plated film (Ni/Pd/Au, μm) | | | 1.5/0.05/0.05 | 5/0.05/0.05 | 10/0.05/0.05 | 1.5/0.1/0.05 |
| | Displacement Au (μm)/ reduction Au (μm) | | | 0.01/0.04 | 0.01/0.04 | 0.01/0.04 | 0.01/0.04 |
| | Results of plating appearance, analysis of cross-section, and film thickness | | | Good, Just as targeted film thickness. | Good, Just as targeted film thickness. | Good, Just as targeted film thickness. | Good, Just as targeted film thickness. |
| | Length from void tip to electrode pad surface (μm) | | | 0.5 | 5.0 | 5.5 | 0.5 |
| | Void width (μm) | | | 0.1 or less | 0.1 or less | 0.1 or less | 0.1 or less |
| | Evaluation of solder properties | | | Good as breakage occurred at the solder in the solder shear test. | Good as breakage occurred at the solder in the solder shear test. | Good as breakage occurred at the solder in the solder shear test. | Good as breakage occurred at the solder in the solder shear test. |
| | Reliability test (HAST test) | | | 0/5 | 0/5 | 0/5 | 0/5 |

TABLE 1-continued

| Wafer | | Configuration of passivation Reagent | SiN (μm) only or SiN (μm)/Pl (μm) Treatment Conditions | Examples 5 SiN 0.5 μm thick | Examples 6 SiN 0.5 μm thick | Examples 7 SiN 0.5 μm thick | Comparative Examples 1 SiN 0.5 μm thick | Comparative Examples 2 SiN 0.5 μm thick |
|---|---|---|---|---|---|---|---|---|
| Processes | Degreasing | WBD400* | 50° C., 2 min | ✓ | ✓ | ✓ | ✓ | ✓ |
| | Etching | UAE100* | 50° C., 1 min | ✓ | ✓ | ✓ | ✓ | ✓ |
| | 30% nitric acid | — | 20° C., 30 sec | ✓ | ✓ | ✓ | ✓ | ✓ |
| | Zincate | WBZ100* | 20° C., 30 sec | ✓ | ✓ | ✓ | ✓ | ✓ |
| | 30% nitric acid | — | 20° C., 15 sec | ✓ | ✓ | ✓ | ✓ | ✓ |
| | Zincate | WBZ100* | 20° C., 15 sec | ✓ | ✓ | ✓ | ✓ | ✓ |
| | Electroless Ni plating | UBN100* | 80° C., 7.5 min / 80° C., 25 min / 80° C., 50 min | ✓ | ✓ | ✓ | ✓ | ✓ |
| | Electroless Pd plating | CA400* | 56° C., 4 min / 56° C., 4 min | ✓ | ✓ | ✓ | ✓ | ✓ |
| | Electroless displacement Au plating | FA500* | 75° C., 6 min / 80° C., 15 min | ✓ | | | | |
| | | FA210* | 75° C., 6 min / 80° C., 15 min | | ✓ | ✓ | ✓ | ✓ |
| | Electroless reduction Au plating | RAP13* | 45° C., 3 min | | | | ✓ | |
| | Target thickness of plated film (Ni/Pd/Au, μm) | | | 1.5/0.05/0.01 | 1.5/0.05/0.015 | 1.5/0.05/0.015 | 1.5/0.05/0.07 | 1.5/0.05/0.03 |
| | Displacement Au (μm)/ reduction Au (μm) | | | 0.01/— | 0.015/— | 0.015/— | 0.03/0.04 | 0.03/— |
| | Results of plating appearance, analysis of cross-section, and film thickness | | | Good, Just as targeted film thickness. | Good, Just as targeted film thickness. | Good, Just as targeted film thickness. | Good, Just as targeted film thickness. | Good, Just as targeted film thickness. |
| | Length from void tip to electrode pad surface (μm) | | | 0.5 | 0.3 | 0.3 | 0.2 | 0.2 |
| | Void width (μm) | | | 0.1 or less | 0.2 | 0.2 | 0.5 | 0.5 |
| | Evaluation of solder properties | | | Good as breakage occurred at the solder in the solder shear test. | Good as breakage occurred at the solder in the solder shear test. | Good as breakage occurred at the solder in the solder shear test. | Good as breakage occurred at the solder in the solder shear test. | Good as breakage occurred at the solder in the solder shear test. |
| | Reliability test (HAST test) | | | 0/5 | 0/5 | 0/5 | 5/5 | 5/5 |

*Manufactured by JK Nippon Mining & Metals Corporation

As indicated in Table 1, it was found in Examples of the present invention that electroless plating was preferably deposited, all breakage interfaces in the solder shear test were solders and the results from the HAST test were good.

REFERENCE CHARACTERS

11 Passivation film
12 Electrode pad
13 Electrolessly-plated nickel film
14 Electrolessly-plated palladium film
15 Electrolessly-plated gold film
A Region of electroless reduction gold plating
B Region of electroless displacement gold plating
P Boundary between reduction gold plating and displacement gold plating
V Void

The invention claimed is:

1. A semiconductor wafer, including:
a substrate provided thereon with
an electrode pad;
a passivation film that covers the upper surface of the substrate and has an opening for exposing the electrode pad; and
an electrolessly-plated nickel film formed on the electrode pad, an electrolessly-plated palladium film formed on the electrolessly-plated nickel film, and an electrolessly-plated gold film formed on the electrolessly-plated palladium film,
wherein a void exists at an interface between the passivation film and the electrolessly-plated nickel film, the void having a length from a tip of the void to the surface of the electrode pad of 0.3 μm or more and a width of 0.2 μm or less, and the entire surface of the electrode pad is covered with the electrolessly-plated nickel film.

2. The semiconductor wafer according to claim 1, wherein the electrolessly-plated nickel film, the electrolessly-plated palladium film, and the electrolessly-plated gold film have a film thickness of 0.5 μm to 15.0 μm, 0.02 μm to 0.50 μm, and 0.01 μm to 0.50 μm, respectively.

3. The semiconductor wafer according to claim 1, wherein the electrolessly-plated gold film includes a displacement gold plated film and a reduction gold plated film, the displacement gold plated film has a thickness of 0.01 μm or less, and the reduction gold plated film has a thickness of 0.01 μm or more.

4. A method for producing the semiconductor wafer according to claim 1, the method including the steps of:

forming the electrode pad on the substrate;

forming the passivation film on the upper surface of the substrate on which the electrode pad is formed;

forming the opening that exposes the electrode pad in the passivation film;

forming, on the exposed electrode pad, the electrolessly-plated nickel film, forming the electrolessly-plated palladium film, and forming the electrolessly-plated gold film, wherein forming the electrolessly-plated gold film includes forming an electrolessly-plated displacement gold film and forming an electrolessly-plated reduction gold film, and in forming the electrolessly-plated displacement gold film, electroless displacement gold plating is performed on the palladium plated film by using, as the electroless displacement gold plating liquid, an electroless displacement gold plating liquid that provides a plated film with a thickness of 20 nm or less upon plating at a plating temperature of 80° C. and a plating time of 15 minutes, or electroless displacement gold plating is performed under plating conditions that provide a plated film with a thickness of 20 nm or less when an electroless displacement gold plating liquid that provides a plated film with a thickness of above 20 nm upon plating at a plating temperature of 80° C. and a plating time of 15 minutes is used.

* * * * *

UNITED STATES PATENT AND TRADEMARK OFFICE
CERTIFICATE OF CORRECTION

PATENT NO. : 11,114,399 B2  
APPLICATION NO. : 16/955448  
DATED : September 7, 2021  
INVENTOR(S) : Takuto Watanabe et al.

Page 1 of 1

It is certified that error appears in the above-identified patent and that said Letters Patent is hereby corrected as shown below:

On the Title Page

Item (73):  
Change "JX NIPPON MINING & METALS COPRORATION, Tokyo (JP)" to --- JX NIPPON MINING & METALS CORPORATION, Tokyo (JP) ---

Signed and Sealed this  
First Day of November, 2022

Katherine Kelly Vidal  
*Director of the United States Patent and Trademark Office*